United States Patent
Pomarico et al.

(10) Patent No.: US 8,289,092 B2
(45) Date of Patent: Oct. 16, 2012

(54) MICROELECTROMECHANICAL RESONANT STRUCTURE HAVING IMPROVED ELECTRICAL CHARACTERISTICS

(75) Inventors: Anna Pomarico, Collepasso Lucce (IT); Pasquale Flora, San Marzano Di San Giuseppe (IT); Annarita Morea, Massafra (IT); Giuditta Roselli, Minervino Murge (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 9 days.

(21) Appl. No.: 12/953,930

(22) Filed: Nov. 24, 2010

(65) Prior Publication Data

US 2011/0128083 A1 Jun. 2, 2011

(30) Foreign Application Priority Data

Nov. 27, 2009 (IT) .............................. TO2009A0929

(51) Int. Cl.
*H03B 5/30* (2006.01)
*H01L 41/02* (2006.01)

(52) U.S. Cl. ........ 331/156; 331/185; 310/345; 310/348; 310/351; 310/353

(58) Field of Classification Search ............... 73/504.12; 310/311, 312, 314, 315, 345, 346, 348, 351, 310/353; 331/116 FE, 116 M, 116 R, 154, 331/156, 175, 176, 185; 333/219, 219.1, 333/234, 235
See application file for complete search history.

(56) References Cited

U.S. PATENT DOCUMENTS

| | | | |
|---|---|---|---|
| 6,393,913 B1 * | 5/2002 | Dyck et al. ................. | 73/504.12 |
| 6,557,413 B2 * | 5/2003 | Nieminen et al. .............. | 73/488 |
| 6,817,244 B2 * | 11/2004 | Platt ............................ | 73/504.16 |
| 7,444,868 B2 * | 11/2008 | Johnson ....................... | 73/504.12 |
| 7,863,697 B2 * | 1/2011 | Yang et al. .................... | 257/415 |
| 7,889,017 B2 * | 2/2011 | Morita et al. ................. | 331/156 |
| 2002/0079743 A1 | 6/2002 | Ma et al. | |
| 2005/0146240 A1 | 7/2005 | Smith et al. | |
| 2008/0150647 A1 | 6/2008 | Yang et al. | |
| 2008/0186109 A1 | 8/2008 | Ho et al. | |

OTHER PUBLICATIONS

Galayko, D. et al., "Clamped-Clamped Beam Micro-Mechanical Resonators in Thick-Film Epitaxial Polysilicon Technology," in Proceedings of the 32nd European Solid-State Device Research Conference (ESSDERC 2002), STMicroelectronics and IEEE Electron Devices Society, Florence, Italy, Sep. 24-26, 2002, pp. 447-450.

Judge J. A. et al., "Attachment Loss of Micromechanical and Nanomechanical Resonators in the Limits of Thick and Thin Support Structures," Journal of Applied Physics 101(1):13521/1-11, Jan. 11, 2007.

(Continued)

*Primary Examiner* — Levi Gannon
(74) *Attorney, Agent, or Firm* — Seed IP Law Group PLLC

(57) ABSTRACT

The present disclosure is directed to a MEMS resonant structure, provided with a substrate of semiconductor material; a mobile mass suspended above the substrate and anchored to the substrate by constraint elements to be free to oscillate at a resonance frequency; and a fixed-electrode structure capacitively coupled to the mobile mass to form a capacitor with a capacitance that varies as a function of the oscillation of the mobile mass; the fixed-electrode structure arranged on a top surface of the substrate, and the constraint elements being configured in such a way that the mobile mass oscillates, in use, in a vertical direction, transverse to the top surface of the substrate, keeping substantially parallel to the top surface.

28 Claims, 6 Drawing Sheets

OTHER PUBLICATIONS

Nguyen C. T.-C. et al., "Design and Performance of CMOS Micromechanical Resonator Oscillators," Proceedings of the 48th IEEE International Frequency Control Symposium, Boston, Massachusetts, Jun. 1-3, 1994, pp. 127-134.

Tang, W. C. et al., "Laterally Driven Polysilicon Resonant Microstructures," Sensors and Actuators 20:25-32, 1989.

Vittoz, E. A., "High-Performance Crystal Oscillator Circuits: Theory and Application," IEEE Journal of Solid-State Circuits 23(3):774-783, Jun. 1988.

Wan-Thai, H., "Vibrating RF MEMS for Timing and Frequency References," IEEE MTT-S International Microwave Symposium Digest, 2006, San Francisco, California, Jun. 11-16, 2006, pp. 672-675.

Wong, A.-C. et al., "Micromechanical Mixer-Filters ('Mixlers')," Journal of Microelectromechanical Systems 13 (1):100-112, Feb. 2004.

Nguyen, C. T.-C., "MEMS Technology for Timing and Frequency Control," IEEE Transactions on Ultrasonics, Ferroelectrics, and Frequency Control 54(2):251-270, Feb. 2007.

Fedder, G. K. et al. "Physical Design for Surface-Micromachined MEMS," Proceedings of the 5th ACM/SIGDA Physical Design Workshop, Reston, Virginia, Apr. 15-17, 1996, pp. 53-60.

* cited by examiner

MICROELECTROMECHANICAL RESONANT STRUCTURE HAVING IMPROVED ELECTRICAL CHARACTERISTICS

BACKGROUND

1. Technical Field

The present disclosure relates to a resonant microelectromechanical structure (MEMS) with improved electrical characteristics, in particular for real-time-clock (RTC) applications, to which the following treatment will make reference without this implying any loss of generality.

2. Description of the Related Art

As is known, RTC devices are commonly used operating as a clock in electronic apparatuses, whether portable or not, such as for example cell phones, video cameras or photographic cameras, automotive apparatuses, electrical household appliances, data-collection terminals, smart-card readers, etc., in order to count the passage of real time (in terms of years, months, days, hours, minutes, and seconds), even when the corresponding electronic apparatuses are turned off. An RTC device generally comprises for the purpose: an oscillator circuit provided with an appropriate resonant structure designed to generate an operating frequency (or resonance frequency), typically of 32.768 kHz; a processing circuit, coupled to the oscillator circuit, for counting the passage of time on the basis of the same operating frequency; and an appropriate power-supply source for providing the electrical supply to the device.

Even though quartz technology has dominated for decades the field of frequency generation (also for real-time-clock applications), in recent times silicon-based MEMS resonators have been proposed, with increasingly greater success. The advantages linked to the use of MEMS resonators are represented above all by a marked reduction in the dimensions and by the considerable reduction in costs, thanks to the possibility of producing the MEMS resonators with standard processes of manufacture of integrated circuits, and to the possibility of integrating at low cost in one and the same chip both the mechanical structure and the corresponding electronic circuit (in the form of ASIC—Application Specific Integrated Circuit).

MEMS resonators include micromechanical structures obtained by means of micromachining techniques, which, due to external stresses (in the form of appropriate electrical biasing), are induced to vibrate at their natural resonance frequency. These micromechanical structures comprise a mobile mass, anchored to a substrate by means of purposely provided mechanical-constraint elements, which is set in resonance. The mobile mass forms, with a fixed-electrode structure coupled thereto, a capacitor, and the vibration in resonance conditions of the mobile mass causes a variation of the capacitance of this capacitor, which is converted into an output signal at the desired operating frequency.

In particular, the solutions up to now proposed for providing silicon MEMS resonators are represented by structures of a lateral type, i.e., ones in which the mobile mass, suspended above the substrate by means of appropriate constraint elements, vibrates in a direction parallel to the same substrate.

The capacitive coupling between the mobile mass and the fixed-electrode structure, which faces it during oscillation, can be obtained with a configuration of a comb-fingered type or with a parallel-plate configuration.

In the comb-fingered configuration (see for example W. C. Tang, T.-C. H. Nguyen, R. T. Howe, "Laterally driven polysilicon resonant microstructures"), the use of a large number of fingers associated to, and extending from, the mobile mass, and of corresponding fixed electrodes facing them, enables a high capacitive coupling to be obtained between the mobile mass and the fixed electrodes. However, it has been shown that it is impossible to regulate the operating frequency of the device (to achieve the so-called "tunability"), and hence also to correct the shifts in the same frequency due to the spread of the technological process and to the temperature shifts. In particular, it has been demonstrated the intrinsic invariance of the resonance frequency with respect to the biasing voltage applied to the electrodes.

In the parallel-plate configuration (see, for example, US 2008/0186109 A1), it is the same mobile mass that constitutes, with its surfaces facing and parallel to corresponding surfaces of the fixed electrodes, one of the plates of the capacitor, the capacitive variation of which is used for generation of the output signal at the desired operating frequency. In this case, it has been shown the possibility of compensating for the possible shifts in the resonance frequency, via variation of the biasing potential applied between the mobile mass and the fixed electrodes. In fact, the variation of the biasing voltage enables modification of the electrostatic force acting on the resonant structure, modifying the state of stress and hence the effective elastic constant. However, this advantage is counterbalanced by the difficulty of obtaining in this case an efficient capacitive coupling, and hence a low equivalent resistance (the so-called "motional resistance") of the mechanical structure.

This drawback is due chiefly to technological limits (linked to the photolithographic technologies used for the definition of the mobile mass) in providing gaps that can be controlled and are sufficiently small (less than a micron) between the mobile mass and the fixed electrodes over the entire wafer, and a facing area that is sufficiently large between the same elements. The lateral gap between the mobile mass and the fixed electrodes is in fact constrained by the minimum resolution of the photolithographic-etching process, whereas the facing area is limited by the reduced thickness of the mobile mass in a direction orthogonal to the substrate.

In greater detail, it may be shown that the equivalent, or motional, resistance $R_m$ of the mechanical structure of the resonator is given by the following expression:

$$R_m = \frac{k_{eq} \cdot d^4}{\omega_0 \cdot Q \cdot V_p^2 \cdot \varepsilon_0^2 \cdot A^2} \tag{1}$$

where $k_{eq}$ is the equivalent elastic constant of the resonant structure, $\omega_0$ is the natural resonance pulse (with $\omega_0 = \sqrt{k_{eq}/m_{eq}}$, where $m_{eq}$ is the equivalent mass of the mobile mass), Q is the quality factor, $V_p$ is the biasing voltage applied between the mobile mass and the fixed-electrode structure, $\varepsilon_0$ is the vacuum permittivity, A is the capacitive coupling surface area, and d is the gap between the mobile mass and the fixed-electrode structure. The motional resistance $R_m$ is hence directly proportional to the fourth power of the gap d, and inversely proportional to the square of the facing surface A.

BRIEF SUMMARY

The present applicant has found that a reduction of the motional resistance would be certainly desirable in so far as it would enable reduction of the energy consumption of the ASIC associated to the micromechanical resonant structure, avoiding in particular the introduction of charge pumps for reaching the high values of biasing voltage. In addition, the reduction of the motional resistance would enable more effective exploitation of the biasing potential for the tunability of the device, both for correction of the shifts of the native frequency (which is intrinsically variable on account of the spread of the photolithographic process) and for the correction of the frequency shifts due to temperature variations.

The present disclosure provides a MEMS resonant structure having improved mechanical and electrical characteristics, in particular as regards the consumption level and the possibility of regulating the resonance frequency.

In one embodiment of the present disclosure, a MEMS resonant structure includes a substrate of semiconductor material having a top surface, a mobile mass suspended above said substrate and anchored to said substrate by a plurality of constraint elements, the mobile mass being configured to oscillate at a resonance frequency, and a fixed-electrode structure capacitively coupled to said mobile mass to form a capacitor with a capacitance that varies as a function of the oscillation of said mobile mass, said fixed-electrode structure being positioned on the top surface of said substrate, and the mobile mass being configured to oscillate in a vertical direction, transverse to said top surface of said substrate.

BRIEF DESCRIPTION OF THE SEVERAL VIEWS OF THE DRAWINGS

For a better understanding of the present disclosure, a preferred embodiment is now described, purely by way of non-limiting example and with reference to the attached drawings, wherein:

FIG. 1b is a lateral cross-sectional view of the structure of FIG. 1a;

DETAILED DESCRIPTION

As will be clarified in detail in what follows, one aspect of the present disclosure envisages providing a micromechanical resonant structure of a vertical type, in which the mobile mass is able to oscillate in resonance in a direction transverse to the top surface of the substrate, instead of parallel to the same substrate. The mobile mass is capacitively coupled, in parallel-plate configuration, to at least one fixed electrode set on the substrate in such a way that the characteristic gap of the resonant structure is to be determined by the height of the layer of air between the mobile mass and the fixed electrode (the thickness of this vertical gap can thus be easily regulated and reduced in value, as described hereinafter, by means of etching and removal of a region of sacrificial material).

Figure 1A:
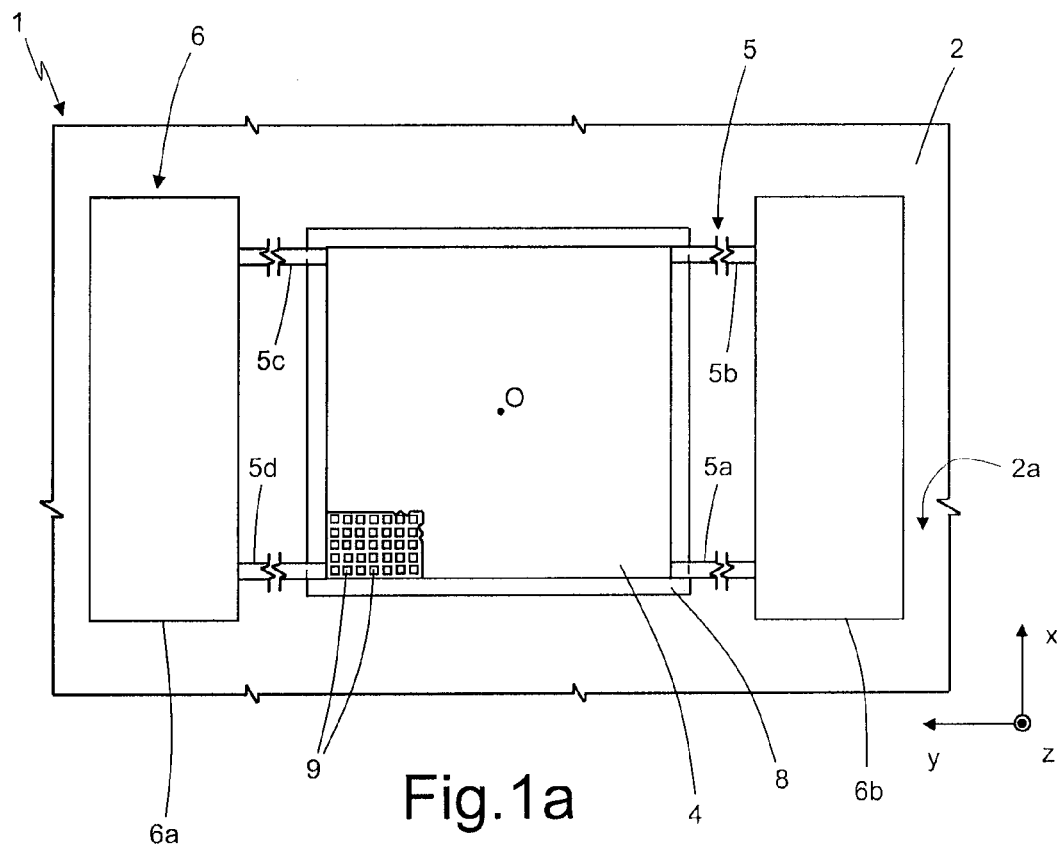
FIG. 1a is a schematic representation, in top plan view, of a MEMS resonant structure according to a first embodiment of the present disclosure.
Figure 1B:
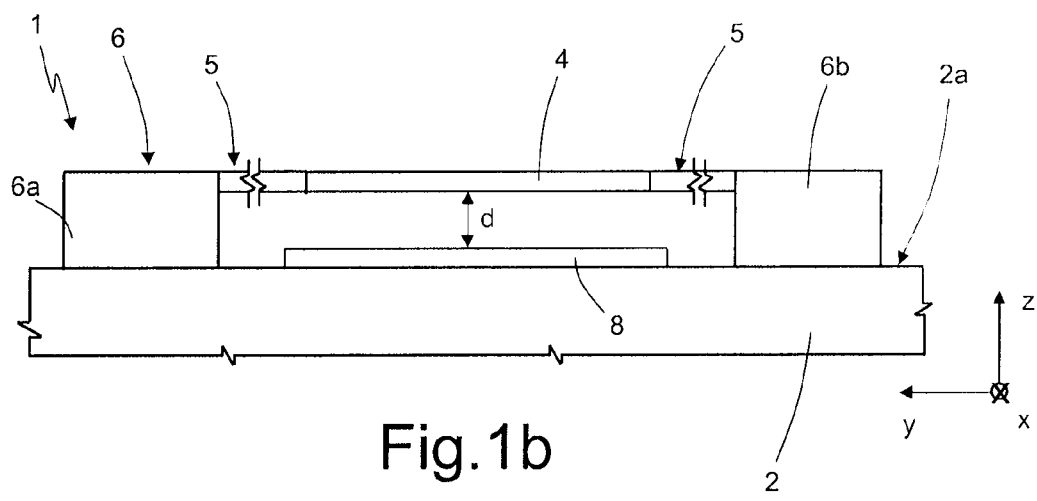

As illustrated schematically in FIGS. 1a and 1b, a MEMS resonant structure, designated as a whole by 1, has a substrate 2 of semiconductor material, in particular silicon, having a top surface 2a with substantially planar extension in a plane xy defined by a first horizontal axis x and a second horizontal axis y.

The MEMS resonant structure 1 comprises a mobile mass 4, of the membrane type (i.e., having a thickness sensibly smaller than its planar extension), suspended above, and anchored to, the substrate 2. In particular, the mobile mass 4 is set parallel to the substrate 2 and has a main extension in the plane xy, and a thickness that is negligible with respect to the main extension, along an orthogonal axis z (vertical direction), perpendicular to the plane xy.

The mobile mass 4 is connected, by means of elastic elements 5, to anchorage elements 6, fixed with respect to the substrate 2; the anchorage elements 6 extend vertically as pillars starting from the top surface 2a of the substrate 2 as far as the level of the mobile mass 4.

In particular, the elastic elements 5 are arranged and configured in such a way that the mobile mass 4 is able to oscillate (when appropriately stimulated, as described hereinafter) along the orthogonal axis z, keeping constantly parallel to the top surface 2a of the substrate 2; the elastic elements 5 are for this purpose compliant along the orthogonal axis z.

In greater detail, in one embodiment, shown in FIGS. 1a, 1b, the mobile mass 4 has, in the plane xy, a substantially square shape, and four elastic elements 5a, 5b, 5c and 5d are present, which extend in a rectilinear way starting from corresponding vertices of the mobile mass 4, along the second horizontal axis y. Two anchorage elements 6a, 6b are also provided, set on opposite sides of the mobile mass 4 with respect to the second horizontal axis y, and two respective elastic elements 5 are connected to each of the anchorage elements 6a, 6b; the anchorage elements 6a, 6b have, for example, in the plane xy, a rectangular shape with an extension along the first horizontal axis x greater than the corresponding extension of the mobile mass 4. The anchorages may in any case vary in shape and number, in a way compatible with the requirements of technological production and with the requirements of mechanical stability of the structure. It may be noted, in particular, that the MEMS resonant structure 1 has, in the illustrated embodiment, a configuration, in the plane xy, symmetrical with respect to the center O of the mobile mass 4.

The mobile mass 4, as illustrated schematically in the detail of FIG. 1a, is moreover traversed by a plurality of through holes 9, for example arranged in a regular lattice with a fixed pitch. Advantageously, the through holes 9 enable, during the process of manufacture of the structure, release of the mobile mass 4, by means of chemical etching of an underlying sacrificial layer (for example, a silicon-oxide layer).

The MEMS resonant structure 1 can in fact be provided using the manufacturing process referred to as "THELMA process" (see, for example: D. Galayko, A. Kaiser, B. Legrand, L. Buchaillot, C. Combi, D. Collard "Clamped-Clamped Beam Micro-Mechanical Resonators in Thick-Film Epitaxial Polysilicon Technology", ESSDERC 2002, European solid-state circuits conference, Florence, pp. 447-450), which envisages providing MEMS structures in thick polysilicon epitaxial layers, in general by means of successive steps of: formation of electrodes and conductive paths, electrically insulated from one another, on a silicon substrate; growth of a sacrificial layer (of silicon oxide) on the substrate; chemical etching for the definition of openings in the sacrificial oxide, in the areas where it is desired to form elements for anchorage to the substrate; growth of an epitaxial layer, once again made of silicon; deep chemical etching of silicon (the so-called "deep silicon etching") for the definition of the mobile and fixed elements of the MEMS structure; and removal of the sacrificial layer by means of chemical etching through holes previously formed through the epitaxial layer, for releasing the mobile elements of the MEMS structure.

A possible sizing of the structure, aimed at obtaining a resonance frequency of 32.768 kHz, envisages, for example, the mobile mass 4 having a side of 229 µm, and the elastic elements 5 having a length extension along the second horizontal axis y of 472 µm; in addition, the elastic elements 5 have, in the example, a width extension along the first horizontal axis x of 4 µm (hence sensibly smaller than the corresponding length), and a thickness (along the orthogonal axis z) substantially equal to the thickness of the mobile mass 4 (the elastic elements being indeed obtained, during the manufacturing process, through definition of the same structural layer of material, in particular silicon). In addition, the through holes 9 have, for example, a side of 5 µm and are set at a distance apart from one another of 4 µm. It should be noted in this regard that the dimensions and the spacing between the through holes 9 affect the effective mass of the mobile mass 4 and hence the resonance frequency.

The MEMS resonant structure 1 further comprises a fixed electrode 8, set on the top surface 2a of the substrate 2 (with the possible interposition of an insulating layer, for example of silicon oxide, here not illustrated), in a position corresponding to and underneath the mobile mass 4, so as to face it and form a sensing capacitor (in parallel-plate configuration). In particular, the fixed electrode 8 and the mobile mass 4 are separated along the orthogonal axis z by a gap (an air gap), designated by d in FIG. 1b, for example of 0.8 µm.

In the embodiment illustrated in FIGS. 1a, 1b, the fixed electrode 8 moreover has in the plane xy a substantially square shape, with dimensions greater than, or (in a way not illustrated) equal to or smaller than, corresponding dimensions of the mobile mass 4 (it is however clear that other shapes may be envisaged for the fixed electrode, as will be also illustrated hereinafter).

In use, an appropriate biasing voltage is applied between the mobile mass 4 and the fixed electrode 8 (in particular an alternate voltage, at a frequency close to the natural resonance frequency of the micromechanical structure); for example, the mobile mass 4 is biased at a biasing voltage $V_p$, whereas the fixed electrode 8 is biased at a reference voltage so as to create an appropriate electrostatic force. The mobile mass 4 is thus brought into oscillation at its natural resonance frequency, and its oscillation causes a corresponding variation of the capacitance of the capacitor that it forms with the fixed electrode 8. This capacitive variation is detected and processed by the associated electronic circuit (ASIC) for the generation of the desired clock frequency (note that the mobile mass 4 and the fixed electrode 8 operate both as actuation and as sensing electrodes in the MEMS resonant structure 1).

The arrangement and configuration of the constraint elements of the mobile mass 4 with respect to the substrate 2 (including in this definition the elastic elements 5 and the anchorage elements 6) cause the mobile mass 4 to move, during its oscillation at the resonance frequency, in a direction transverse to the substrate 2 (in particular along the orthogonal axis z), keeping constantly parallel to the top surface 2a of the substrate 2 (i.e., without undergoing any deformation). An appropriate design of the same constraint elements makes it possible to guarantee that the vibration modes in the plane xy are sufficiently distant from the useful mode of vibration in a direction perpendicular to the substrate 2 along the orthogonal axis z, preventing risks of interference that could jeopardize the electrical performance of the structure.

In particular, the resonance frequency $f_0$ of the MEMS resonant structure 1 is given by the following expression:

$$f_0 = \frac{1}{2\pi} \cdot \sqrt{\frac{k_{eq}}{m_{eq}}} \qquad (2)$$

where $k_{eq}$ is the equivalent elastic constant of the resonant structure and $m_{eq}$ the equivalent mass of the mobile mass 4.

Consequently, once the geometry of the mobile mass 4 has been set (in terms of its dimensions and of the dimensions of the through holes 9 traversing it), and hence its equivalent mass $m_{eq}$, the desired value of the resonance frequency $f_0$ is obtained by appropriately sizing the elastic elements 5, and in particular their length and width (given a same thickness), to obtain the value of the elastic constant $k_{eq}$ corresponding to the desired resonance frequency. In addition, an appropriate design of the constraint elements, for example making them more or less stiff, may enable increase or decrease of the dimensions of the mobile mass 4, albeit maintaining the operating frequency fixed (the possibility of choosing in a range of elastic constants and, consequently, of dimensions of the mobile mass 4 hence adds a degree of flexibility in the design of the structure, facilitating achievement of the desired electromechanical performance).

The particular configuration of the vibration structure hence advantageously enables exploitation of the small value of the vertical gap (d) that it is possible to obtain between the mobile mass 4 and the fixed electrode 8 located on the substrate 2, with known manufacturing processes (for example, the aforesaid THELMA process). The value of this vertical gap is sensibly smaller, and moreover more easily controllable, than the corresponding lateral gap that can be obtained with traditional photolithographic techniques (and that distinguishes known MEMS resonators of a lateral type). This entails a dual advantage: on the one hand, the high degree of controllability of the vertical gap increases the reproducibility of the electromechanical characteristics of the MEMS resonant structure 1 (and of the corresponding resonant device) on a large scale; on the other hand, the reduction of the gap enables (see the foregoing discussion) a reduction in the motional resistance of the micromechanical structure, also enabling a high coefficient of tunability to be obtained.

In this regard, it may be shown that the tunability coefficient, which describes the extent of variation Δf of the resonance frequency $f_0$ as the applied biasing voltage $V_p$ varies, is given by $$\frac{\Delta f}{f_0} = \frac{\varepsilon_0 \cdot A}{k_{eq} \cdot d^3} \cdot V_p^2 \qquad (3)$$

The higher this coefficient, the easier it is, even with small variations of the value of the biasing voltage $V_p$, to vary the resonance frequency $f_0$ of the MEMS resonant structure 1. In the structure described, a high value of the aforesaid coefficient $\Delta f/f_0$ is guaranteed by the large area A of capacitive coupling between the mobile mass 4 and the fixed electrode 8, and by the reduced gap d separating them along the orthogonal axis z (in particular, note that the facing area A is much greater as compared to lateral-facing solutions, where one of the two dimensions of the coupling surfaces is necessarily limited by the thickness of the mobile mass and of the associated electrodes, in the region of a few microns or at most ten microns). Consequently, it is possible to effectively correct with reduced variations of the biasing voltage $V_p$ (and hence with reduced energy consumption) both the shifts of native frequency and the shifts of the resonance frequency as the temperature varies.

This aspect is further emphasized by the fact that, as the present applicant has been able to prove by means of finite-element simulations, the configuration described for the MEMS resonant structure 1 (and in particular for the corresponding constraint elements) causes the vibrating mobile mass 4 to remain constantly parallel to the substrate 2, maintaining the conditions of capacitive coupling with the associated fixed electrode 8 ideal. Instead, it is known that in other configurations, with lateral gap, occurrence of a deformation of the geometry of the mobile mass is common during vibration, at the area of capacitive interaction with the corresponding fixed-electrode structure.

Variants may in any case be envisaged as regards the configuration of the constraint elements associated to the mobile mass 4, in terms, for example, of the shape, number, and arrangement of the elastic elements 5 and of the anchorage elements 6. In addition, shape variations of the same mobile mass 4 may be envisaged.

Figure 2:
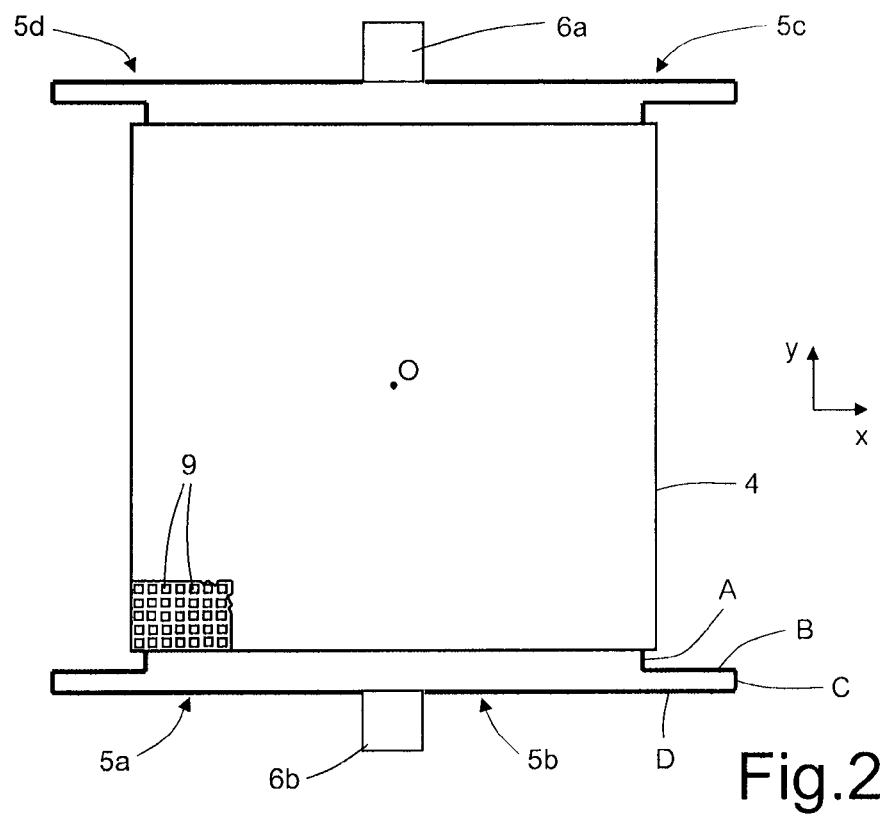
FIGS. 2-6 are schematic representations, in top plan view, of portions of MEMS resonant structures according to further embodiments of the present disclosure.

For example, as illustrated in FIG. 2, the elastic elements 5 can be of the folded type, thus enabling a saving of area for obtaining the same value of the equivalent constant $k_{eq}$. In addition, the use of elastic elements of the folded type, instead of linear or rectilinear ones, enables reduction in the warping due to the residual stress, inevitably present in the silicon wafer, which would risk, if excessive, jeopardizing functionality of the microelectromechanical structures. It has been found that the use of elastic elements of the folded type guarantees that the effect of typical values of release stress (from 5 MPa to 10 MPa) at the operating frequency is negligible (in the region of a few hertz). Instead, it has been found (from finite-element simulations) that corresponding structures with linear elastic elements can sometimes have variations even of the order of kilohertz in the presence of the same typical values of release stress.

In particular, four elastic elements 5a-5d are again present, which extend starting from the vertices of the mobile mass 4, reaching, in pairs, one and the same anchorage element 6. In this case, the anchorage elements 6a, 6b (which are once again two in number and arranged on opposite sides of the mobile mass 4 with respect to the second horizontal axis y) are moreover arranged centrally with respect to the mobile mass 4 (along a horizontal axis of symmetry), having a square shape (in the plane xy) and dimensions smaller than those of the mobile mass (note, however, in this regard, that the dimensions of the anchorage regions do not affect directly the resonance characteristics of the structure). Again, also in this embodiment, the MEMS resonant structure 1 is symmetrical in the plane xy with respect to the center O of the mobile mass 4.

In greater detail, in the embodiment illustrated in FIG. 2, each of the elastic elements 5 has rectilinear portions set, in twos, at right angles (and extending along the first horizontal axis x or the second horizontal axis y) to form the folds of the elastic elements, namely: a first portion A, connected to a respective vertex of the mobile mass 4 and extending along the second horizontal axis y, with an extension, for example, of 15 µm; a second portion B, extending along the first horizontal axis x starting from the end of the first portion A not connected to the mobile mass 4, towards the outside of the mobile mass (extending away therefrom), with an extension for example of 78 µm; a third portion C, extending along the second horizontal axis y starting from the second portion B and extending away from the mobile mass 4, with an extension, for example, of 15 µm; and a fourth portion D, extending along the first horizontal axis x towards the center of the mobile mass 4, starting from the third portion C until it connects up to a respective anchorage element 6, with an extension of, for example, 258 µm. In the example illustrated in FIG. 2, the mobile mass 4 moreover has a side of 454 µm, and, in addition, the width of the various elastic elements 5 is 5 µm.

Once again, during operation, the configuration of the constraint elements mechanically coupled to the mobile mass 4 is such that the mobile mass 4 oscillates in resonance along the orthogonal axis z, without undergoing deformation and hence maintaining itself substantially parallel to the top surface 2a of the substrate 2, during its movement. In addition, appropriate sizing of the elastic elements 5 and of the mobile mass 4 enables a desired value for the resonance frequency $f_0$ to be obtained, for example of 32.768 kHz in the case of real-time-clock applications.

Figure 3:
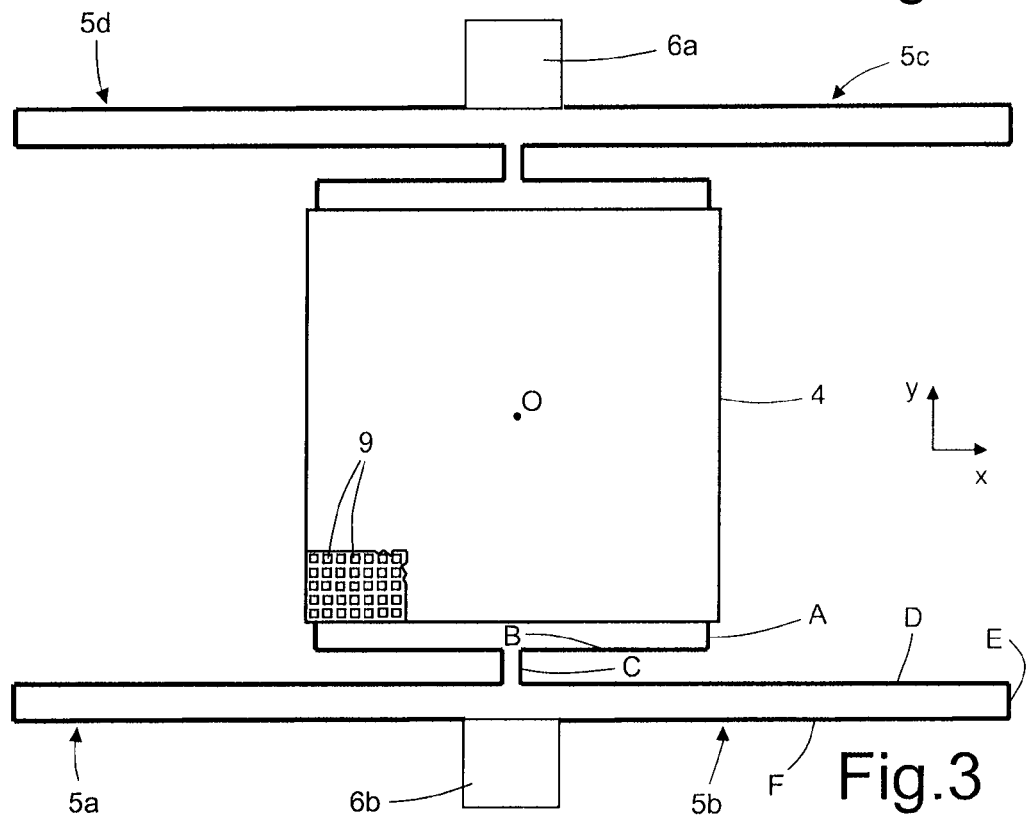

As is shown in FIG. 3, it is possible to obtain a further saving in the dimensions of the MEMS resonant structure 1, through the use of a mobile mass 4 of smaller lateral dimensions and longer elastic elements (but conveniently folded a greater number of times). In this case, each of the elastic elements 5 further comprises: a fifth portion E, extending along the second horizontal axis y starting from the fourth portion D, with an extension for example of 15 µm; and a sixth portion F, extending along the first horizontal axis x starting from the fifth portion E until it connects up to the respective anchorage element 6, with an extension of 251 µm. In this case, the second portion B has an extension of 105 µm, and extends internally with respect to the mobile mass 4 (towards the corresponding center O), instead of externally thereto. In addition, the fourth portion D extends externally with respect to the mobile mass 4 for an extension of 251 µm. In this embodiment, the mobile mass 4 moreover has a side of 229 µm, and the width of the various elastic elements 5 is 4 µm.

Figure 4:
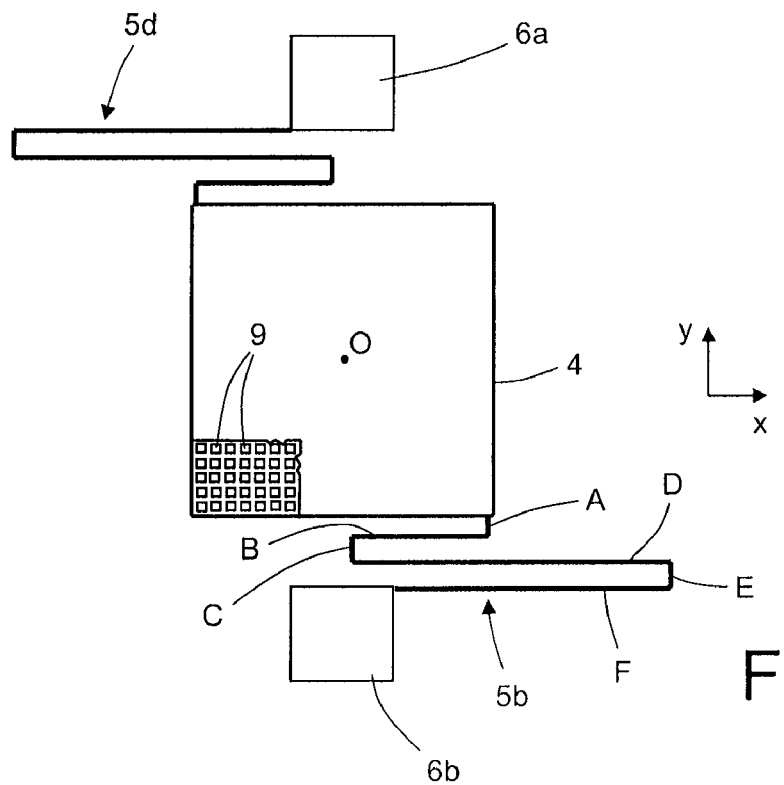

In a further embodiment, shown in FIG. 4, only two elastic elements 5 are, instead, provided, namely, the elastic elements previously designated by 5b and 5d, obtained as described previously with reference to FIG. 3.

Figure 5:
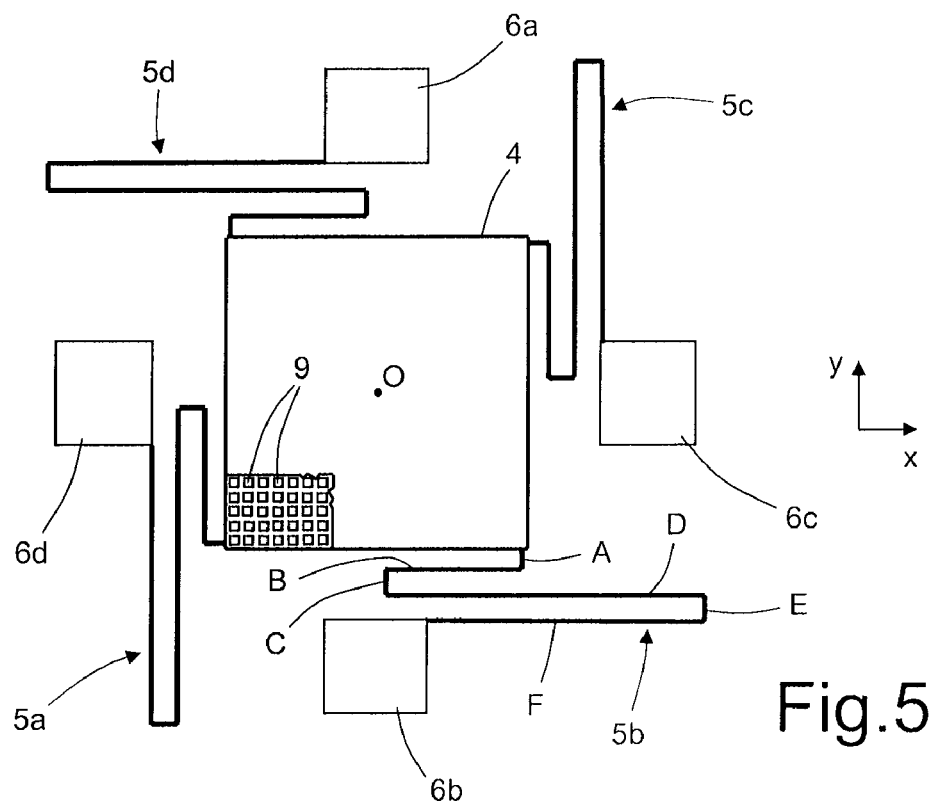

The embodiment shown in FIG. 5 envisages, instead, use of two further anchorage elements 6 (designated by 6c, 6d), which are set on opposite sides of the mobile mass 4 with respect to the first horizontal axis x, centrally with respect thereto. In this case, four elastic elements 5 are again provided, each of the folded type (as described with reference to FIG. 3) and extending starting from a respective vertex of the mobile mass 4 until it connects up to a respective anchorage element 6 (in particular, note that in this case the first portions A of the various elastic elements 5a-5d extend in directions that are orthogonal two by two, along the first horizontal axis x or second horizontal axis y).

Figure 6:
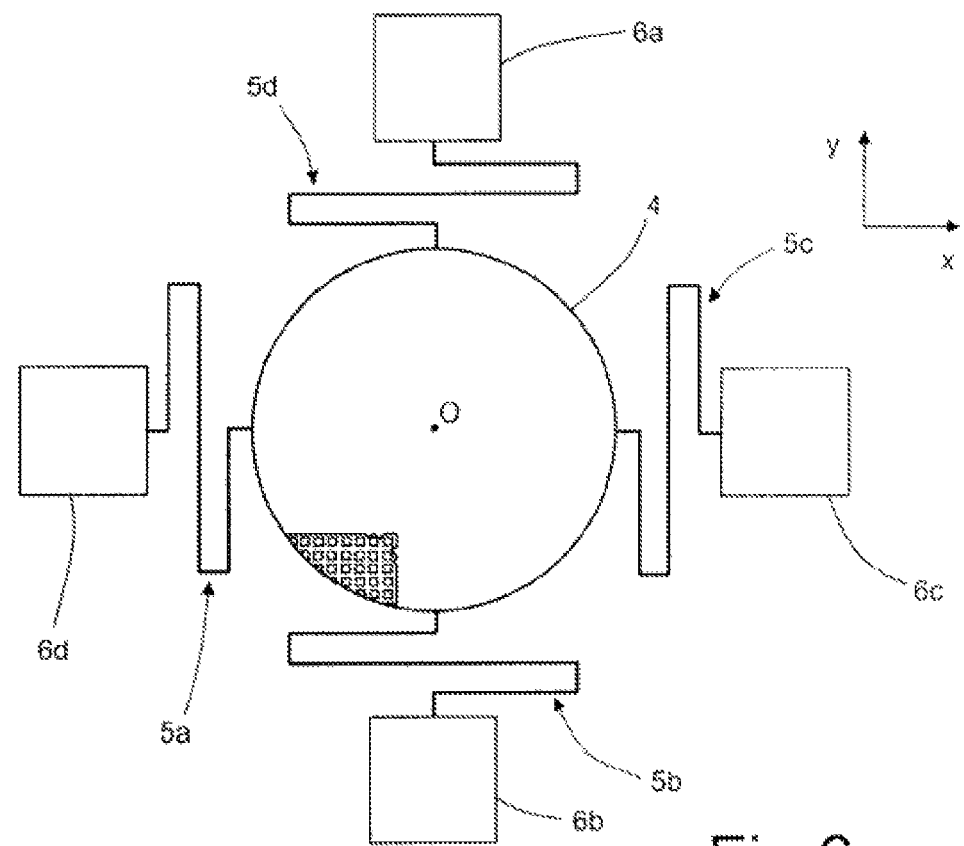

Yet a further embodiment, shown in FIG. 6, envisages a different shape for the mobile mass 4, which in the plane xy has in this case a circular shape.

In this embodiment, four elastic elements 5a-5d and four respective anchorage elements 6a-6d are again provided. The anchorage elements 6a-6d are arranged centrally with respect to the mobile mass 4, in twos aligned along the first horizontal axis x or the second horizontal axis y. The elastic elements 5a-5d, again of the folded type, have a symmetrical arrangement with respect to the horizontal axes x, y and extend from the mobile mass 4 towards a respective anchorage element 6a-6d.

The MEMS resonant structure 1 can hence advantageously replace traditional quartz resonant structures in oscillator circuits, for example for RTC applications.

Figure 7:
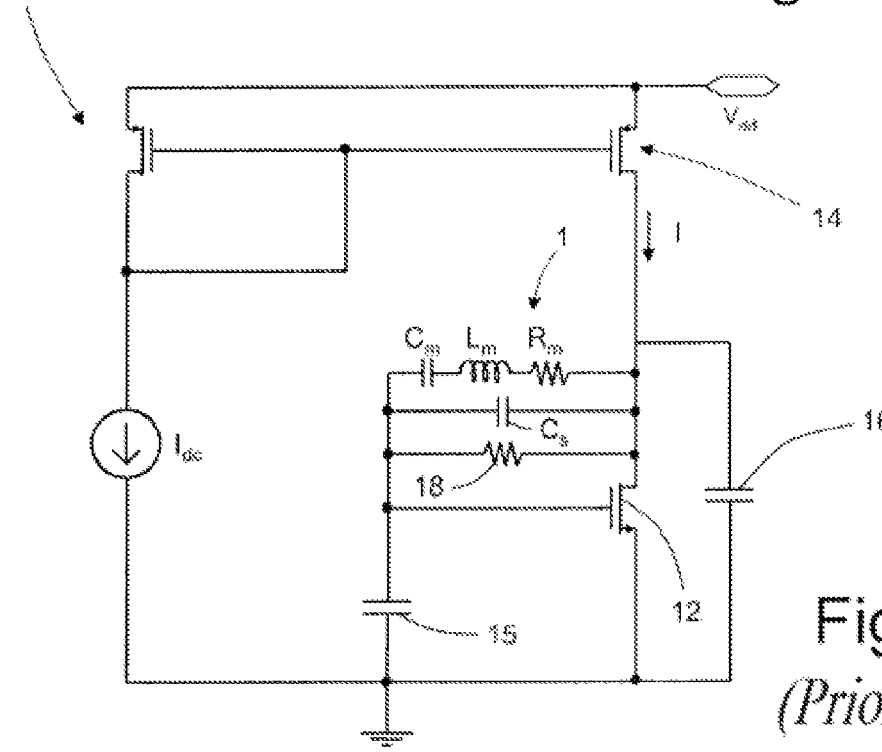
FIG. 7 shows an oscillator circuit that can be coupled, in use, to the MEMS resonant structure.

In this regard, FIG. 7 shows an oscillator circuit, designated as a whole by 10, having an architecture of a known type, the so-called Pierce architecture (from the name of its inventor). The MEMS resonant structure 1 is shown in FIG. 7 by means of the equivalent electrical model, constituted by the series of a motional capacitance $C_m$, a motional inductance $L_m$, and a motional resistance $R_m$, in parallel with a coupling capacitance $C_s$, which is due to the electrostatic coupling between the mobile mass 4 and the fixed electrode 8. The MEMS resonant structure 1 is connected between the gate and drain terminals of a MOS transistor 12, having its source terminal connected to a reference terminal (ground terminal). The drain terminal of the MOS transistor 12 is moreover connected to a current generator 14 (of the current-mirror type, as illustrated but not described in detail); a first load capacitor 15 is connected between the gate terminal of the MOS transistor 12 and the reference terminal, whilst a second load capacitor 16 is connected between the drain terminal of the transistor and the reference terminal. In addition, a biasing resistor 18 is connected in parallel to the MEMS resonant structure 1, between the drain and gate terminals of the MOS transistor 12.

Operation of the oscillator circuit 10, of a known type, is not described in detail herein; reference may, however, be made to E. A. Vittoz, M. Degrauwe, S. Bitz "High-performance crystal oscillator circuits: theory and application", IEEE Journal of Solid-State Circuits, vol. 23, no. 3, June 1988, pp. 774-783, for further information in this regard.

A further aspect of the present disclosure envisages modifying the MEMS resonant structure 1 in order to further improve its tunability characteristics, for regulation of the resonance frequency to compensate for process spread and temperature shifts.

The present applicant has in fact noted that the traditional approach for obtaining this regulation, which envisages, as discussed previously, the variation of the value of the biasing voltage $V_p$ applied between the mobile mass 4 and the fixed electrode 8, may not be altogether satisfactory, owing to the fact that a variation in the biasing voltage $V_p$ entails also a variation in the motional resistance $R_m$ (see the foregoing discussion and in particular Eq. (1), showing the link between the biasing voltage $V_p$ and the value of the motional resistance $R_m$). To compensate for the variation of motional resistance as the temperature varies and, consequently, of motional current at output from the MEMS resonant structure 1 given the same driving voltage, it may in this case be useful to introduce a stage for controlling the loop gain, designed to compensate for the losses, with a consequent additional energy expenditure.

To solve the above drawback, further fixed electrodes are introduced in the MEMS resonant structure 1, dedicated to the operation of regulation of the resonance frequency, and for this reason defined in what follows as "regulation electrodes". These regulation electrodes are biased with a potential varying between 0 and $V_p$ ($V_p$ being the value of the biasing voltage applied to the mobile mass 4), whilst the biasing state of the mobile mass 4 with respect to the fixed electrode 8 is kept constant.

Figure 8A:
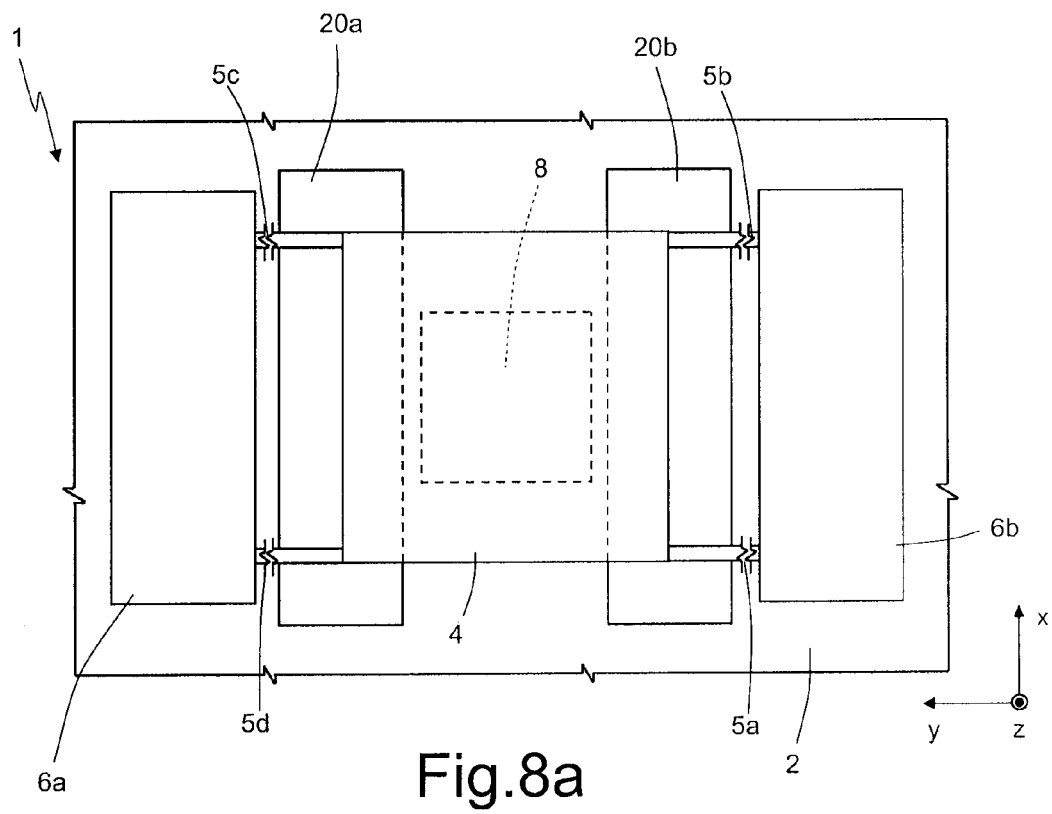
FIGS. 8a and 8b show, respectively, in a top plan view and in a lateral cross-sectional view, a MEMS resonant structure according to a further embodiment of the present disclosure.
Figure 8B:
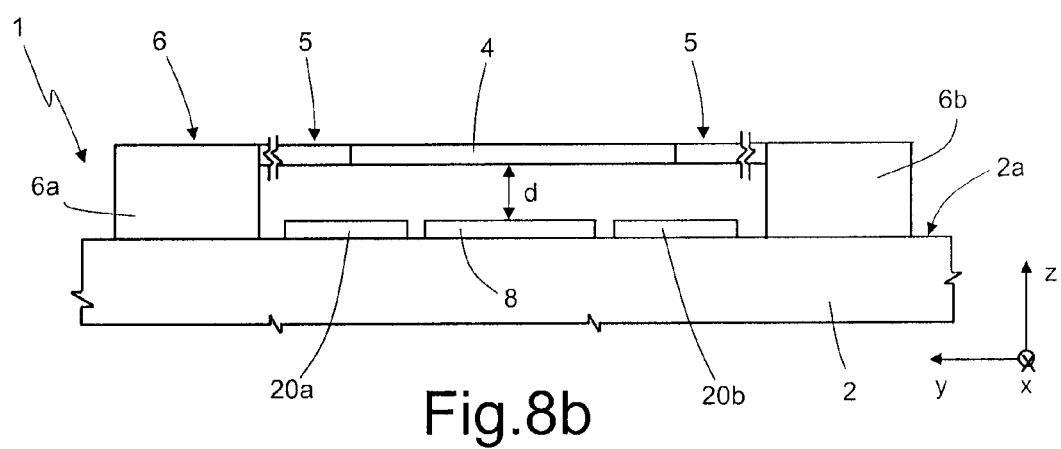

A possible embodiment is shown in FIGS. 8a and 8b; the fixed electrode 8 has in this case smaller dimensions as compared to the structure illustrated in FIGS. 1a and 1b, and in particular smaller than those of the mobile mass 4, which is superimposed thereon. The MEMS resonant structure 1 comprises in this case two regulation electrodes 20a, 20b, arranged on the top surface 2a of the substrate 2, laterally with respect to the fixed electrode 8 (with respect to the second horizontal axis y), in such a way as to be at least in part located underneath the mobile mass 4. The regulation electrodes 20a, 20b have, in the plane xy, a rectangular shape, elongated along the first horizontal axis x, for example, with an extension greater than the corresponding extension of the mobile mass 4.

In particular, the voltage applied to the regulation electrodes 20a, 20b has a value that varies between 0 and $V_p$ as a function of the variation of the resonance frequency $f_0$ that it is desired to compensate, so as to vary the resultant electrostatic force acting on the mechanical structure. In this way, it is possible to obtain a fine regulation of the value of the resonance frequency $f_0$, and at the same time keep the potential difference between the mobile mass 4 and the fixed electrode 8 constant, thus keeping constant the corresponding motional resistance. In other words, the solution described enables a complete separation to be obtained between the actuation/sensing elements (mobile mass 4 and fixed electrode 8) and the elements for regulating the resonance frequency (regulation electrodes 20a, 20b).

The advantages of the MEMS resonant structure 1 emerge clearly from the foregoing description.

In any case, it is again emphasized that the structure proposed, with vertical vibration, enables a gap of a reduced and controllable value to be obtained between the mobile mass and the associated fixed-electrode structure, thus improving the electromechanical characteristics of the MEMS resonant structure (in particular, in terms of its reproducibility on a large scale, of the reduction of the levels of consumption, and of the improved tunability of the resonance frequency value).

In addition, the use of dedicated elements for regulating the resonance frequency (distinct from the actuation and sensing elements) enables further improvement of the tunability characteristics of the MEMS resonant structure.

The use of silicon as structural material for forming the MEMS resonant structure is moreover advantageous in so far as the structure, excluding materials that are heterogeneous with respect to silicon, is affected to a lesser extent by the thermal stress due to temperature shifts, has a release stress that is more foreseeable and controllable as compared to structures with two or more heterogeneous materials in contact, and resists better in conditions of high pressure and/or humidity.

The use of the THELMA process for manufacturing the MEMS resonant structure is advantageous in so far as it guarantees considerably lower production costs as compared to other known manufacturing processes. In particular, thanks to the standard THELMA process it is possible to obtain simultaneously good mechanical properties of the micromachined structures and an excellent control of the vertical gap.

In addition, the symmetry of the MEMS resonant structure 1 can advantageously improve the linearity.

Finally, it is clear that modifications and variations may be made to what has been described and illustrated herein, without thereby departing from the scope of the present disclosure.

In particular, as it has been previously highlighted, the shape, arrangement, and configuration of the elastic elements and of the anchorage elements associated to the mobile mass (as well as the shape and arrangement of the same mobile mass) can vary with respect to what has been illustrated, provided that the constraint elements are in any case as a whole configured so as to cause the mobile mass to oscillate vertically in a direction transverse with respect to that of the substrate.

Figure 9A:
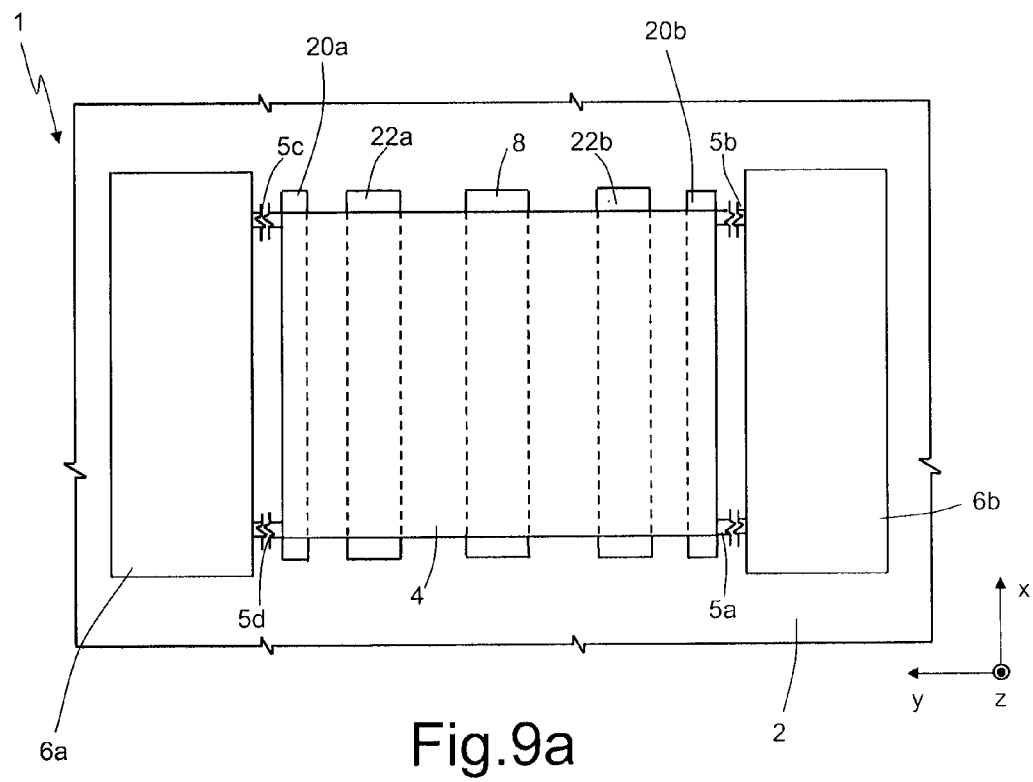
FIGS. 9a and 9b show, respectively, in a top plan view and in a lateral cross-sectional view, a MEMS resonant structure according to yet a further embodiment of the present disclosure.
Figure 9B:
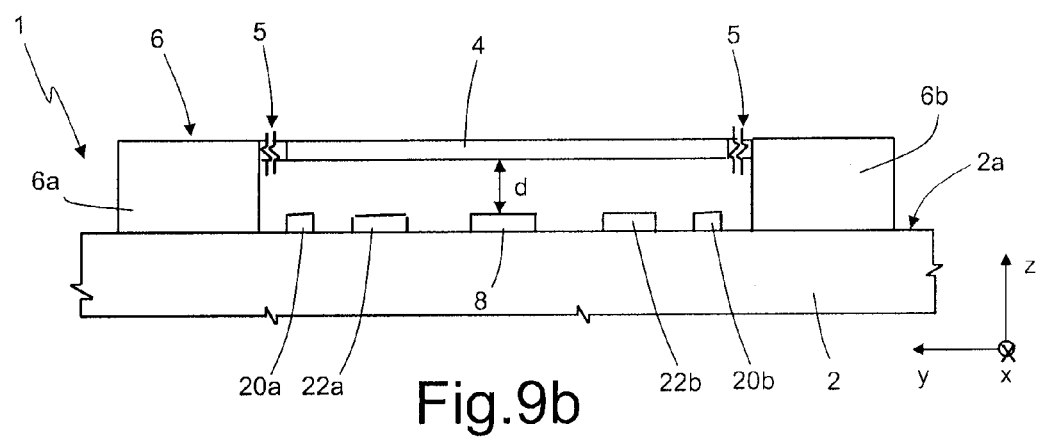

In addition, yet a further embodiment of the present disclosure, shown in FIGS. 9a and 9b, envisages the use of distinct actuation and sensing electrodes. In particular, the fixed electrode 8, set underneath the mobile mass 4, centrally with respect thereto, has in this case only a function of actuation; two further sensing electrodes 22a, 22b are instead provided, which are set on the substrate 2 and underneath the mobile mass 4, laterally and on opposite sides of the fixed electrode 8 with respect to the second horizontal axis y, and have the function of detecting the oscillations of the mobile mass 4 at the resonance frequency. Also in this case, the regulation electrodes 20a, 20b are present, biased at an appropriate regulation voltage (comprised between 0 and $V_p$). Note that the dimensions of the regulation electrodes 20a, 20b and of the fixed electrode 8 are, in this embodiment, different from those illustrated in FIGS. 8a, 8b (without this implying a different operation).

Said solution, which enables uncoupling of the actuation elements from the sensing ones, is advantageous from the standpoint of integration of the electronic circuitry associated to the microelectromechanical structure, given that it avoids the need for a decoupling stage (constituted by capacitances and resistances), which may otherwise be used (given that the mobile mass 4 would be biased at a high continuous voltage, the biasing voltage $V_p$, and simultaneously be driven by an alternate current to close the sensing loop).

Furthermore, it is clear that the described resonant structure can advantageously be used in further applications, for example in high-frequency reference oscillators.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS resonant structure, comprising:
a substrate of semiconductor material having a top surface;
a plurality of constraint elements configured to be compliant in a vertical direction;
a mobile mass suspended above said substrate and anchored to said substrate by the plurality of constraint elements, the mobile mass having a planar extension that is configured to move substantially uniformly as a whole, the mobile mass being configured to oscillate at a resonance frequency; and
a fixed-electrode structure capacitively coupled to said mobile mass to form a capacitor with a capacitance that varies as a function of the oscillation of said mobile mass, said fixed-electrode structure being positioned on the top surface of said substrate, and said constraint elements being configured to expand and contract to enable the mobile mass to oscillate substantially uniformly in the vertical direction, transverse to said top surface of said substrate.

2. The structure according to claim 1, wherein said vertical direction is orthogonal to said top surface of said substrate.

3. The structure according to claim 1, wherein the main extension of the mobile mass is a substantially planar extension in a horizontal plane that is orthogonal to the vertical direction; and wherein said constraint elements are configured to enable the mobile mass to oscillate in the vertical direction while the mobile mass remains substantially parallel to said top surface of said substrate.

4. The structure according to claim 1, wherein said constraint elements comprise anchorage elements fixed to said substrate, and elastic elements extending from said mobile mass to said anchorage elements; said elastic elements being compliant in said vertical direction.

5. The structure according to claim 4, wherein the main extension of the mobile mass is a substantially planar extension in a horizontal plane defined by a first horizontal axis and a second horizontal axis and said anchorage elements include a first anchorage element and one second anchorage element, which are positioned on opposite sides of said mobile mass with respect to said first horizontal axis or second horizontal axis.

6. The structure according to claim 5, wherein said first and second anchorage elements are set centrally, and externally, with respect to said mobile mass.

7. The structure according to claim 4, wherein said elastic elements are of a folded type.

8. The structure according to claim 4, wherein said elastic elements extend starting from respective vertices of said mobile mass and connect, in pairs, up to a respective one of said anchorage elements.

9. The structure according to claim 1, further comprising regulation electrodes arranged on said top surface of said substrate and capacitively coupled to said mobile mass; said regulation electrodes being configured to receive a regulation voltage to vary an electrostatic force acting on said mobile mass, and consequently the value of said resonance frequency.

10. The structure according to claim 9, further comprising supply circuitry configured to provide the regulation voltage, said fixed-electrode structure including an actuation electrode set on said top surface of said substrate underneath said mobile mass, and said regulation electrodes are set laterally with respect to said actuation electrode, at least partially underneath said mobile mass; and wherein the supply circuitry is configured to provide a biasing voltage between said actuation electrode and said mobile mass of a substantially constant amplitude.

11. The structure according to claim 10, wherein the supply circuitry is configured to provide the regulation voltage to have a value that varies between a zero value and the value of said biasing voltage, as a function of a shift of the value of said resonance frequency due to process spread or temperature shifts.

12. The structure according to claim 10, wherein said fixed-electrode structure further comprises a first sensing electrode and a second sensing electrode, which are set on said top surface of said substrate underneath said mobile mass, laterally and on opposite sides of said actuation electrode; said first and second sensing electrodes being configured to form with said mobile mass a capacitor with a capacitance that vary as a function of the oscillation of said mobile mass.

13. The structure according to claim 1, wherein said resonance frequency is a real-time-clock frequency.

14. The structure according to claim 1 wherein the plurality of constraint elements include a first constraint element and a second constraint element coupled to opposing sides of the mobile mass, each of the first and second constraint elements having an elongated first portion coupled to the mobile mass, an elongated second portion coupled to the substrate, and a third portion extends between the first and the second portions.

15. The structure according to claim 14 wherein the second portion is longer than the first portion.

16. The structure according to claim 14 wherein the third portion is transverse to the elongated first and second portions.

17. An oscillator circuit, comprising:
a MEMS resonant structure, including:
a substrate of semiconductor material having a top surface;
a plurality of constraint elements configured to expand and contract in a vertical direction that is transverse to the top surface of the substrate;
a mobile mass suspended above said substrate and anchored to said substrate by the plurality of constraint elements, the mobile mass having a planar extension that is configured to move substantially uniformly as a whole, the mobile mass being configured to oscillate at a resonance frequency; and
a fixed-electrode structure capacitively coupled to said mobile mass to form a capacitor with a capacitance that varies as a function of the oscillation of said mobile mass, said fixed-electrode structure being positioned on the top surface of said substrate, and said constraint elements being configured to enable the mobile mass to oscillate substantially uniformly in the vertical direction; and
a biasing stage configured to bias said mobile mass and said fixed-electrode structure.

18. The circuit according to claim 17, further comprising a processing stage coupled to said MEMS resonant structure and configured to process said resonance frequency starting from the variation of said capacitance.

19. The circuit according to claim 17, further comprising regulation electrodes arranged on said top surface of said substrate and capacitively coupled to said mobile mass; said regulation electrodes being configured to receive a regulation voltage to vary an electrostatic force acting on said mobile mass, and consequently a value of said resonance frequency.

20. The structure according to claim 19, wherein said fixed-electrode structure comprises an actuation electrode set on said top surface of said substrate underneath said mobile mass, and said regulation electrodes are set laterally with respect to said actuation electrode, at least partially underneath said mobile mass; and wherein said biasing stage is configured to apply, between said actuation electrode and said mobile mass, a biasing voltage of substantially constant amplitude.

21. A method, comprising:
forming a MEMS resonant structure, the forming including:
forming a fixed-electrode structure on a top surface of a substrate;
forming a mobile mass capacitively coupled to the fixed-electrode structure, the mobile mass being configured to substantially uniformly oscillate at a resonance frequency, the mobile mass having a main extension that is substantially uniformly spaced from the top surface of the substrate in a resting state; and
forming a plurality of constraint elements coupled to the mobile mass, the constraint elements being configured to anchor the mobile mass to the substrate and to expand and contract in a vertical direction to enable the mobile mass to oscillate in the vertical direction transverse to the top surface of the substrate, the main extension as a whole being configured to be substantially uniformly spaced from the top surface of the substrate as the mobile mass oscillates.

22. The method of claim 21, further comprising forming a biasing stage coupled to the mobile mass and the fixed-electrode structure, the biasing stage being configured to bias said mobile mass and said fixed-electrode structure.

23. The method of claim 21, further comprising:
forming a first regulation electrode on the top surface of the substrate, the first regulation electrode being adjacent a first side of the fixed-electrode structure and capacitively coupled to the mobile mass; and
forming a second regulation electrode on the top surface of the substrate, the second regulation electrode being adjacent a second side of the fixed-electrode structure and capacitively coupled to the mobile mass.

24. The method of claim 23, further comprising:
forming first and second sensing electrodes on the top surface of the substrate between the mobile mass and the first and the second regulation electrodes, respectively.

25. A MEMS resonant structure, comprising:
a substrate of semiconductor material having a top surface;
a plurality of constraint elements;
a mobile mass suspended above the substrate and anchored to the substrate by the plurality of constraint elements, the mobile mass being configured to oscillate at a resonance frequency;
a fixed-electrode structure capacitively coupled to the mobile mass to form a capacitor with a capacitance that varies as a function of the oscillation of the mobile mass, the fixed-electrode structure being positioned on the top surface of the substrate, and the constraint elements being configured to enable the mobile mass to oscillate in a vertical direction, transverse to the top surface of the substrate, the fixed-electrode structure including:
an actuation electrode positioned on the top surface of the substrate underneath the mobile mass;
regulation electrodes being positioned on the top surface of the substrate and capacitively coupled to the mobile mass, the regulation electrodes being positioned laterally with respect to the actuation electrode, at least partially underneath the mobile mass, the regulation electrodes being configured to receive a regulation voltage to vary an electrostatic force acting on the mobile mass to change the resonance frequency.

26. The structure of claim 25, further comprising supply circuitry configured to supply a biasing voltage of substantially constant amplitude between the actuation electrode and the mobile mass.

27. The structure according to claim 26, wherein the supply circuitry is configured to provide the regulation voltage with a value that varies between a zero value and a value of the biasing voltage, as a function of a shift of a value of the resonance frequency due to process spread or temperature shifts.

28. The structure according to claim 26, wherein the fixed-electrode structure further comprises a first sensing electrode and a second sensing electrode each positioned on the top surface of the substrate underneath the mobile mass, laterally and on opposite sides of the actuation electrode, the first and second sensing electrodes being configured to form with the mobile mass a first and a second capacitor with a first and a second capacitance, respectively, that vary as a function of the oscillation of the mobile mass.

* * * * *